(12) United States Patent
Ishiguma et al.

(10) Patent No.: US 8,812,188 B2
(45) Date of Patent: Aug. 19, 2014

(54) VEHICLE ELECTRIC POWER MANAGEMENT APPARATUS, VEHICLE ELECTRIC POWER MANAGEMENT SYSTEM, AND VEHICLE ELECTRIC POWER MANAGEMENT PROGRAM

(75) Inventors: Hirofumi Ishiguma, Yokohama (JP);
Masaki Hasunuma, Tokyo (JP);
Shigeru Ohta, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 60 days.

(21) Appl. No.: 13/590,851

(22) Filed: Aug. 21, 2012

(65) Prior Publication Data

US 2013/0218405 A1    Aug. 22, 2013

(30) Foreign Application Priority Data

Sep. 13, 2011  (JP) ................................ 2011-199687

(51) Int. Cl.
*G01M 17/00*    (2006.01)
(52) U.S. Cl.
USPC ........... 701/34.4; 701/22; 701/33.4; 701/123; 320/109
(58) Field of Classification Search
USPC ................. 701/22, 29.1, 33.4, 34.4, 99, 123; 320/109; 180/65.1, 65.21
See application file for complete search history.

(56) References Cited

U.S. PATENT DOCUMENTS

| | | | | |
|---|---|---|---|---|
| 7,309,966 B2 * | 12/2007 | Wobben | ........................ | 318/139 |
| 7,777,434 B2 * | 8/2010 | Wobben | ........................ | 318/139 |
| 8,415,919 B2 * | 4/2013 | Saito et al. | .................... | 320/109 |
| 2011/0055036 A1 * | 3/2011 | Helfan | ........................ | 705/26.1 |
| 2011/0202219 A1 * | 8/2011 | Ishibashi | ........................ | 701/22 |
| 2012/0136574 A1 * | 5/2012 | Kobayashi et al. | ........... | 701/533 |

FOREIGN PATENT DOCUMENTS

JP    2010-231258    10/2010

* cited by examiner

*Primary Examiner* — Russell Frejd
(74) *Attorney, Agent, or Firm* — Foley & Lardner LLP (57) ABSTRACT

A vehicle electric power management apparatus calculates a distance from a facility to a destination, from received vehicle-change request information. Distances through which vehicles parked at the facility can travel are calculated and vehicle information on parked vehicles capable of traveling through a distance longer than the distance to the destination are selected as next-useable vehicles in descending order of a residual amount of available battery power. A surplus distance indicating how far in kilometers the selected vehicles can each further travel on beyond the destination away from the facility is additionally calculated and this information is transmitted. After the selection of the next-useable vehicles by a computer of the facility, increment/decrements in the residual amount of available battery power between each selected next-useable vehicle and the vehicle that a user has used to arrive at the facility, and incentive information are calculated and displayed at the computer.

7 Claims, 9 Drawing Sheets

CONNECTED TO VEHICLES AND FACILITIES

USER INFORMATION

| USER i | RESIDUAL POWER ON ARRIVAL AT FACILITY: a kwh | VEHICLE A/ FACILITY P | TOTAL POINT COUNT |
|---|---|---|---|
| USER j | RESIDUAL POWER ON ARRIVAL AT FACILITY: x kwh | VEHICLE X/ FACILITY Q | TOTAL POINT COUNT |

VEHICLE INFORMATION

| VEHICLE A | RESIDUAL POWER | FACILITY NAME: FACILITY P | TRAVEL DISTANCE/ kwh | FULL-CHARGE POWER |
|---|---|---|---|---|
| VEHICLE C | RESIDUAL POWER | FACILITY NAME: FACILITY P | TRAVEL DISTANCE/ kwh | FULL-CHARGE POWER |
| VEHICLE X | RESIDUAL POWER | FACILITY NAME: FACILITY Q | TRAVEL DISTANCE/ kwh | FULL-CHARGE POWER |

VEHICLE ELECTRIC POWER MANAGEMENT APPARATUS, VEHICLE ELECTRIC POWER MANAGEMENT SYSTEM, AND VEHICLE ELECTRIC POWER MANAGEMENT PROGRAM

CROSS-REFERENCE TO RELATED PATENT APPLICATIONS

Japan Priority Application 2011-199687, filed Sep. 13, 2011 including the specification, drawings, claims and abstract, is incorporated herein by reference in its entirety.

BACKGROUND OF THE INVENTION

1. Field of the Invention

The present invention relates to a vehicle electric power management apparatus, vehicle electric power management system, and vehicle electric power management program for managing and supplying information on available electric power remaining in vehicle-mounted batteries.

2. Description of the Related Art

Systems for managing operational schedules relating to service stations for charging vehicle batteries are known to exist in connection with car sharing in which electric automobiles are shared. JP-2010-231258-A, for example, discloses such a system. The system described in JP-2010-231258-A manages and operates the vehicles owned by a car-sharing business operator company. According to JP-2010-231258-A, the system efficiently manages and operates the vehicles according to schedules of the battery-charging service stations and in accordance with the residual amounts of available electric power stored within the batteries of the vehicles, prescheduled dates and time of the vehicle usage, preplanned driving distances, and other vehicle usage conditions of car-sharing service user members.

SUMMARY OF THE INVENTION

The system described in JP-2010-231258-A has a problem in that when a user changes one vehicle for another vehicle, the user cannot recognize a relative increase or decrease in the residual amount of available battery electric power between the two vehicles due to the change, and hence unable to effectively utilize the available electric power remaining in the vehicle-mounted battery.

The present invention provides, as an aspect thereof, a vehicle electric power management apparatus for a vehicle electric power supply system, the vehicle electric power supply system including vehicles each equipped with a battery, facilities each for supplying battery electric power to each of the vehicles, the vehicle electric power management apparatus for collecting information on a residual amount of useable vehicle-mounted battery electric power, and a terminal unit for receiving the residual-power information from the vehicle electric power management apparatus, the vehicle electric power management apparatus including: vehicle information storing means for internally holding the information relating to the residual available electric power of each vehicle; search means for a user, before changing vehicles at one of the facilities to travel therefrom to a destination, to retrieve the residual-power information from the vehicle information storing means and search for a vehicle having a residual amount of available electric power sufficient for traveling through a distance to the destination; processing means for calculating a relative increment/decrement in the residual amount of available electric power between the vehicle that the user has traveled to the facility, and the vehicle searched for as a vehicle to be next used; and output means for delivering, as a notification to the user, information on the calculated increment/decrement in the residual amount of available electric power due to the vehicle change, and information on the vehicle to be next used, to the terminal unit.

The present invention provides, as another aspect thereof, a vehicle electric power management system for a vehicle electric power supply system, the vehicle electric power supply system including vehicles each equipped with a battery, facilities each for supplying battery electric power to each of the vehicles, the vehicle electric power management apparatus for collecting information on a residual amount of useable vehicle-mounted battery electric power, and a terminal unit for receiving the residual-power information from the vehicle electric power management apparatus; wherein: the vehicle electric power management apparatus includes vehicle information storing means for internally holding the information relating to the residual available electric power of the vehicle, search means for a user, before changing vehicles at one of the facilities to travel therefrom to a destination, to retrieve the residual-power information from the vehicle information storing means and search for a vehicle having a residual amount of available electric power sufficient for traveling through a distance to the destination, processing means for calculating a relative increment/decrement in the residual amount of available electric power between the vehicle that the user has traveled to the facility, and the vehicle searched for as a vehicle to be next used, and output means for delivering, to the terminal unit, information on the calculated increment/decrement in the residual amount of available electric power due to the vehicle change, and information on the vehicle to be next used; the terminal unit includes receiving means for receiving the residual-power increment/decrement information delivered from the vehicle electric power management apparatus, and the information relating to the vehicle to be next used, display means for displaying the received residual-power increment/decrement information and the information relating to the vehicle to be next used, input means for selecting, in response to specification by the user, the displayed information relating to the vehicle to be next used, and transmission means for transmitting the selected vehicle information to the vehicle electric power management apparatus; and the vehicle electric power management apparatus stores and manages increments/decrements in residual amounts of available electric power, on a user-by-user basis, in accordance with the vehicle information selected by users using the terminal unit.

The present invention provides, as yet another aspect thereof, a vehicle electric power management program for controlling a computer used for a vehicle electric power management apparatus for a vehicle electric power supply system, the vehicle electric power supply system including vehicles each equipped with a battery, facilities each for supplying battery electric power to each of the vehicles, the vehicle electric power management apparatus for collecting information on a residual amount of useable vehicle-mounted battery electric power, and a terminal unit for receiving the residual-power information from the vehicle electric power management apparatus, the program causing the computer to function as: means for storing the residual-power information on the vehicle into vehicle information storing means; search means for a user, before changing vehicles at one of the facilities to travel therefrom to a destination, to retrieve the residual-power information from the vehicle information storing means and search for a vehicle having a residual amount of available electric power sufficient for traveling through a distance to the destination; processing means for calculating a relative increment/decrement in the residual amount of available electric power between the vehicle that the user has traveled to the facility, and the vehicle searched for as a vehicle to be next used; and means for delivering, as a notification to the user, information on the calculated increment/decrement in the residual amount of available electric power due to the vehicle change, and information on the vehicle to be next used, to the terminal unit.

The present invention enables a user, before the user changes one vehicle for another vehicle, to accurately recognize a relative increase or decrease in the residual amount of available battery electric power between the two vehicles due to the change, and select a vehicle to which the available amount of electric power in the battery of the vehicle which the user has used so far can be provided. Hence, the available electric power remaining in the battery of this vehicle can be utilized effectively.

BRIEF DESCRIPTION OF THE DRAWINGS

Other objects and advantages of the invention will become apparent from the following description of embodiments with reference to the accompanying drawings in which.

DESCRIPTION OF THE PREFERRED EMBODIMENTS

Figure 1:
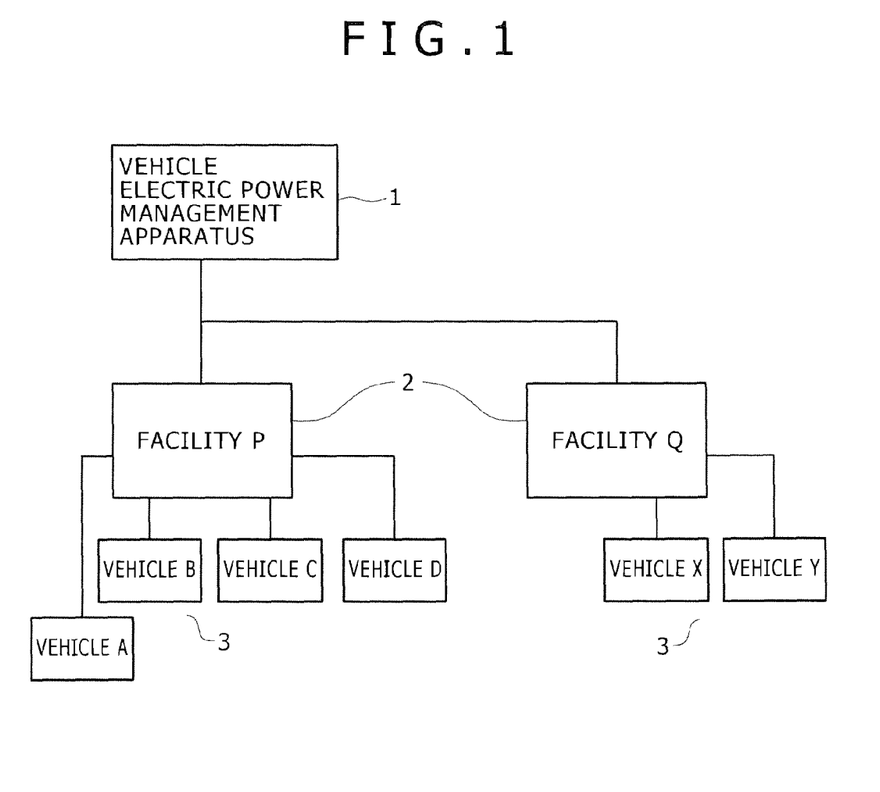
FIG. 1 is a diagram showing a configuration of a vehicle electric power supply system according to an embodiment.

FIG. 1 is a diagram showing a configuration of a vehicle electric power supply system according to an embodiment. A vehicle electric power management apparatus 1, connected to two facilities 2, via network lines, exchanges residual-power information and the like with the facilities 2. The facilities 2, namely a facility P and a facility Q, are both connected to the vehicle electric power management apparatus 1 by way of example, and both facilities are substantially of the same configuration. Vehicles 3 are electric automobiles, each with a battery mounted thereupon. When one of the vehicles 3 arrives at one of the facilities 2, this vehicle 3 becomes connected to the particular facility 2 via a network line and transmits information that includes residual-power information about the vehicle-mounted battery, to the facility 2. At the facility 2, the vehicle 3 also has its battery charged, for example.

FIG. 1 shows, by way of example, vehicles A to D, each parked at the facility P, and vehicles X and Y, both parked at the facility Q, as the vehicles 3, and each vehicle is substantially of the same configuration. The facilities 2 are, for example, commercial facilities such as department stores or amusement facilities, or industrial facilities such as companies, or public facilities such as hospitals or administrative institutions, or transportation facilities such as bus terminals, or the like, and the facilities 2 each include equipment for at least supplying electric power to, or receiving electric power from, the batteries of the vehicles 3.

Figure 2:
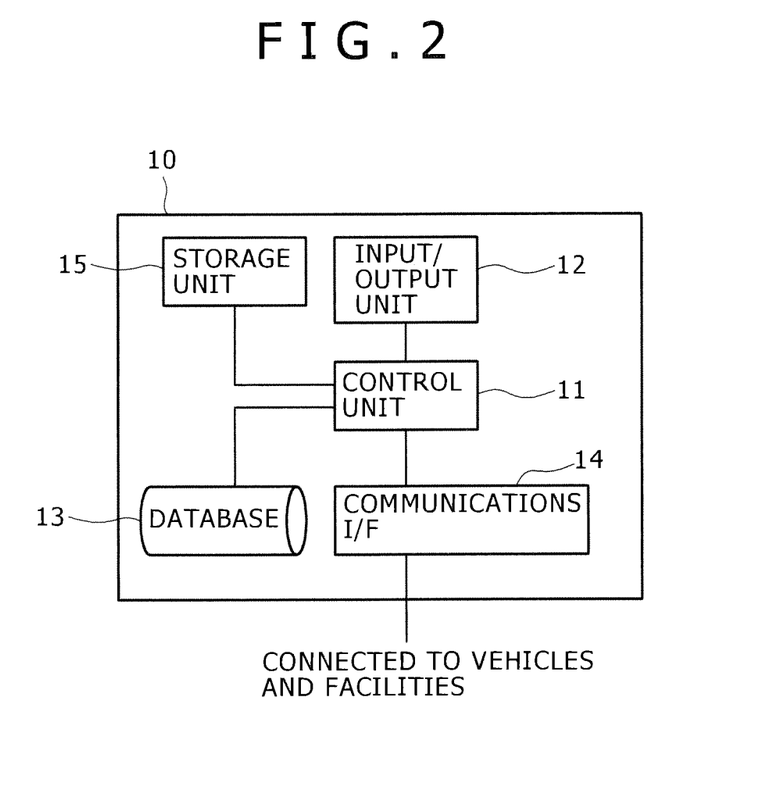
FIG. 2 is a diagram showing a configuration of a computer of a vehicle electric power management apparatus.

FIG. 2 is a diagram showing a configuration of a computer 10 belonging to the vehicle electric power management apparatus 1. The computer 10 includes a control unit 11, an input/output unit 12, a database 13, a communications interface (I/F) 14, and a storage unit 15. The input/output unit 12, the database 13, the communications interface (I/F) 14, and the storage unit 15 are respectively connected to the control unit 11.

In addition to a CPU not shown, the control unit 11 includes a program that the CPU is to use to execute a process shown in a flowchart described later herein. The control unit 11 controls the input/output unit 12, database 13, and communications interface (I/F) 14 connected to the control unit 11, and exchanges various data with the three elements. The program is recorded on a recording medium, such as semiconductor memory, that is located inside the control unit 11, and the CPU can read the program. This recording medium does not have its location limited to an internal section of the control unit 11 and may be provided outside the control unit 11.

The input/output unit 12 includes an input unit of the computer 10, such as a keyboard, and an output unit of the computer 10, such as a display. The database 13, detailed structures of which will be described later herein, includes a database of vehicle information and a database of user information. Map information for searching for distances (and the like) from the facilities to a destination is also stored within the database 13. The communications I/F 14, connected to the facilities 2 or the vehicles 3 via a network line, exchanges residual-power information and the like. The storage unit 15 temporarily holds received information (and the like) inside.

Figure 3:
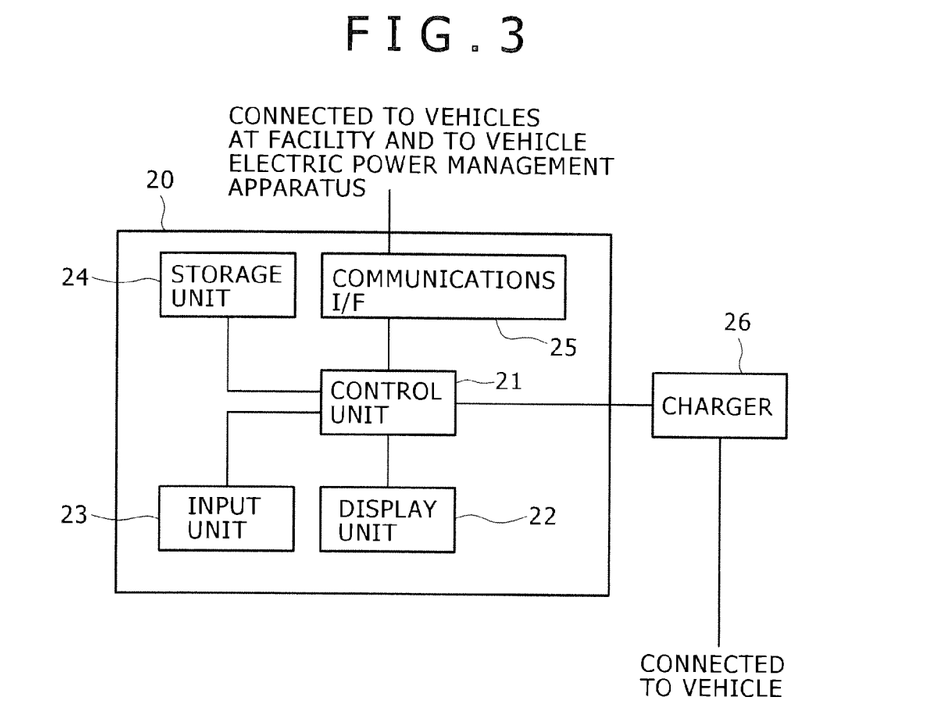
FIG. 3 is a diagram showing a configuration of a computer of a facility and a battery charger of the facility.

FIG. 3 is a diagram showing a configuration of a computer 20 of one facility 2. The computer 20 includes a control unit 21, a display unit 22, an input unit 23, a storage unit 24, and a communications interface (I/F) 25. The display unit 22, the input unit 23, the storage unit 24, and the communications interface (I/F) 25 are respectively connected to the control unit 21.

In addition to a CPU not shown, the control unit 21 includes a program that the CPU is to use to execute a process shown in a flowchart described later herein. The control unit 21 controls the display unit 22, input unit 23, storage unit 24, and communications I/F 25 connected to the control unit 21, and exchanges various data with the four elements. The program is recorded on a recording medium, such as semiconductor memory, that is located inside the control unit 21, and the CPU can read the program. This recording medium may be provided outside the control unit 21.

The display unit 22 displays, as a notification to the user, the information relating to the increment/decrement in the residual amount of available battery power due to the vehicle change, the information relating to the vehicle to be next used, and other information. The input unit 23 includes, for example, a keyboard and a transparent touchscreen panel or the like disposed on a front face of the display unit 22, and the input unit 23 is used for the user to select, by touching the touchscreen panel, any one of next-useable vehicles and the like displayed on the display unit 22. The input unit 23 may also have a card reader for reading a user ID previously stored on an IC card, magnetic card, or equivalent that the user has. In this case, the user ID can be entered by making the card reader read it.

A name of the facility is stored in the storage unit 24. The storage unit 24 is also provided for temporary storage of the residual-power information that has been received from the vehicles 3, and the data that has been entered from the input unit 23. The communications I/F 25, connected via network lines to the vehicle electric power management apparatus 1 and the vehicles 3 parked at the facility, exchanges the residual-power information and other information with these elements. More specifically, the communications I/F 25 exchanges the residual-power information and other information, at the facility P, with the vehicle electric power management apparatus 1 and the vehicles A-D, while at the facility Q, with the vehicle electric power management apparatus 1 and the vehicles X, Y. The communications I/F 25 also transfers the stored residual-power information relating to the batteries of the vehicles 3, from the storage unit 24 to the vehicle electric power management apparatus 1.

A battery charger 26 receives the electric power supplied from a power supply service-providing company via a power line not shown. The battery charger 26, connected via a power line to each vehicle 3 parked at the facility, charges the battery mounted on the vehicle 3. When necessary, the battery charger 26 receives electric power from the battery mounted on the vehicle 3 and charges the batteries of other vehicles. The battery charger 26 is also connected to the control unit 21 of the computer 20, and the battery charger 26 controls charging. In addition, the battery charger 26 periodically detects the residual amount of available electric power in the battery of the vehicle 3 parked at the facility 2, and stores information on the detected residual-power of the battery into the storage unit 24.

Figure 4:
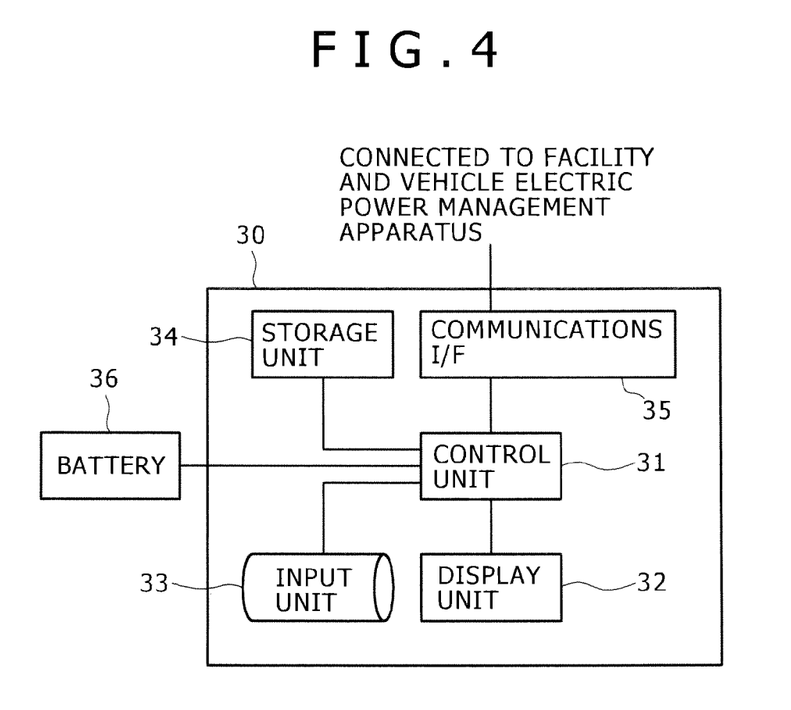
FIG. 4 is a diagram showing a configuration of a computer of a vehicle.

FIG. 4 is a diagram showing a configuration of a computer 30 of the vehicle 30. The computer 30 includes a control unit 31, a display unit 32, an input unit 33, a storage unit 34, and a communications interface (I/F) 35. The display unit 32, the input unit 33, the storage unit 34, and the communications (I/F) 35 are respectively connected to the control unit 31.

The control unit 31 includes a CPU and a program that the CPU is to use to execute a process shown in a flowchart described later herein. The control unit 31 controls the display unit 32, input unit 33, storage unit 34, and communications I/F 35 connected to the control unit 31, and exchanges various data with the four elements. The program is recorded on a recording medium, such as semiconductor memory, that is located inside the control unit 31, and the CPU can read the program. This recording medium may be provided outside the control unit 31.

The display unit 32 displays such information as relating to the residual amount of available battery power in the vehicle. The input unit 33 has functions such as giving an instruction for transmission of the residual-power information. The storage unit 34 temporarily holds, for example, data that has been entered from the input unit 33. The communications I/F 35, connected to the corresponding facility 2 and the vehicle electric power management apparatus 1 via network lines, exchanges the residual-power information and other information with these elements. The battery 36 supplies electric power to a power unit (now shown) in the vehicle 3, while being connected to and charged by the battery charger 26. The battery 36 is connected to the control unit 31. When the vehicle 3 arrives at the facility 2, the available amount of electric power remaining in the battery 36 is detected as the residual-power information, the information of which is then transmitted to the facility 2 and the vehicle electric power management apparatus 1 via the communications I/F 35.

Figure 5A:
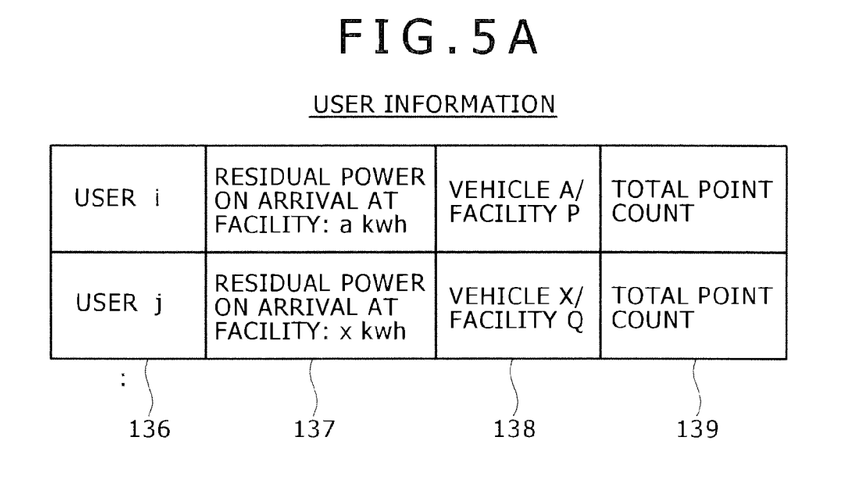
FIGS. 5A and 5B are diagrams that show database structures of the vehicle electric power management apparatus, FIG. 5A showing the database structure of user data, and FIG. 5B showing the database structure of vehicle information.
Figure 5B:
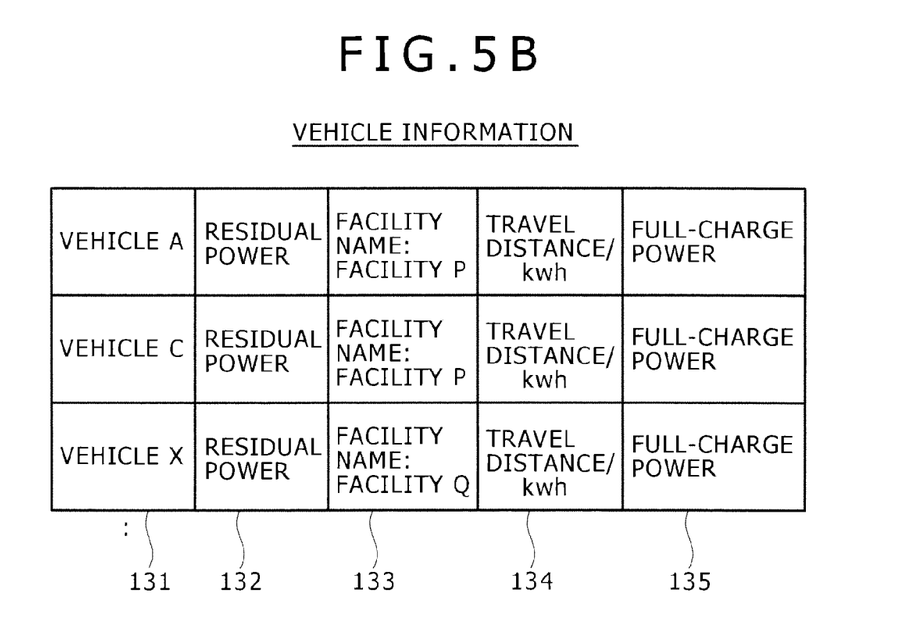

FIGS. 5A and 5B are diagrams that show structures of the database 13 within the computer 10 of the vehicle electric power management apparatus 1. FIG. 5A shows the database structure of user data. Records each consist of four items, namely a user ID 136, an upon-arrival residual available battery power 137, an arrival vehicle name/arrival facility name combination 138, and a total point count 139. The database of user data contains each record with the user ID 136 as a key. In the example of FIG. 5A, the following is stored under a first record of the database: a user "i" as the user ID 136; information relating to the residual amount of available battery power of the vehicle which the user "i" has used to arrive at the facility, as the residual-power information 137; a name of the vehicle A which the user "i" has used, and the name of the facility P at which the vehicle has arrived, as the arrival vehicle name/arrival facility name combination 138; and the total number of points that the user "i" has obtained so far, as the total point count 139.

FIG. 5B shows the database structure of vehicle information on the vehicles parked at the facilities, by way of example. Records each consist of five items, namely a vehicle name 131, residual power 132, a facility name 133, a per-unit-power travel distance 134, and full-charge power 135. The database of vehicle information contains each record with the vehicle name 131 as a key. Irrespective of whether or not the vehicles 3 parked at the facilities 2 are each being battery-charged, the residual amount of available electric power of the battery 36 mounted on each vehicle 3 is periodically detected and then transmitted as residual-power information to the vehicle electric power management apparatus 1 via a network line. The computer 10 receives the residual-power information and periodically updates the database 13. Thus, up-to-date residual-power information on the vehicle 3 is stored. In the example of FIG. 5B, the following is stored under a first record of the database: the vehicle A as the vehicle name 131; the residual amount of currently available battery power of the vehicle A, as the residual power 132; the facility P where the vehicle is parked, as the facility name 133; the distance through the vehicle has traveled per unit power, as the per-unit-power travel distance 134; and the amount of power that the battery of the vehicle A can supply when fully charged, as the full-charge power 135.

Figure 6:
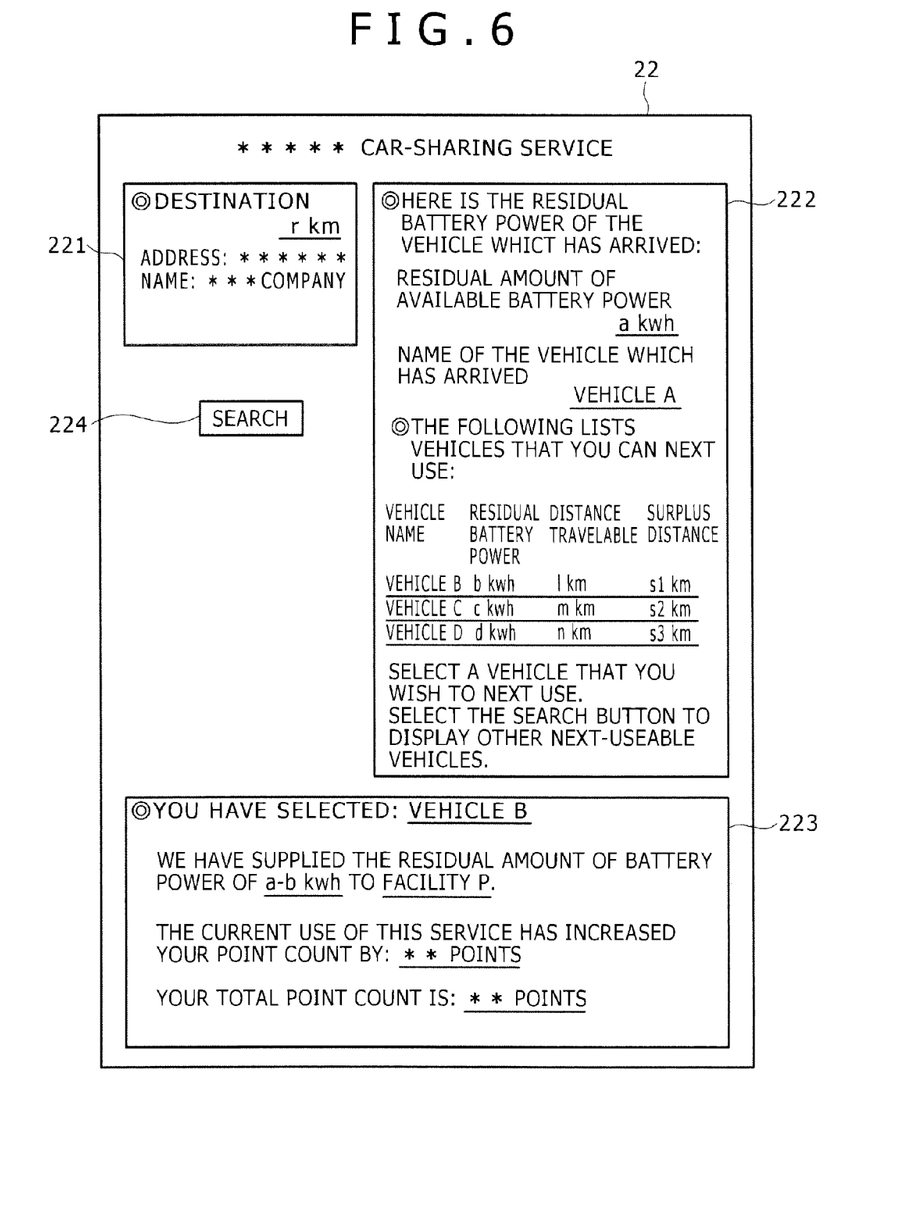
FIG. 6 is a diagram showing a display unit of the computer disposed at the facility.

FIG. 6 is a diagram showing the display unit 22 of the computer 20 disposed at each facility 2. The transparent touchscreen panel is disposed on the front face of the display unit 22, and the user selects, by touching the touchscreen panel, a display position corresponding to any one of the next-useable vehicles and the like displayed on the display unit 22. The display unit 22 includes at least four elements. One is a display area 221 for displaying, in addition to information on a destination entered from the input unit 23 of the computer 20, a distance (to the destination) transmitted from the vehicle electric power management apparatus 1 in response to a result of the above entry. One is a display area 222 for displaying, in addition to the next-useable vehicles, the battery residual-power information transmitted from the vehicle electric power management apparatus 1. One is a display area 223 for displaying, for example, the number of points transmitted as incentive information from the vehicle electric power management apparatus 1. One is a search button 224 for the user to specify searching for a destination and a vehicle to be next used. A selection of any one of the next-useable vehicles displayed in the display area 222 is conducted by, in the example of FIG. 6, touching the display position of either the vehicle B, C, or D displayed as the vehicle name.

Hereunder, operation of the vehicle electric power management apparatus and vehicle electric power supply system in the present embodiment will be described referring to FIGS. 7A, 7B, 8A, 8B.

Figure 7A:
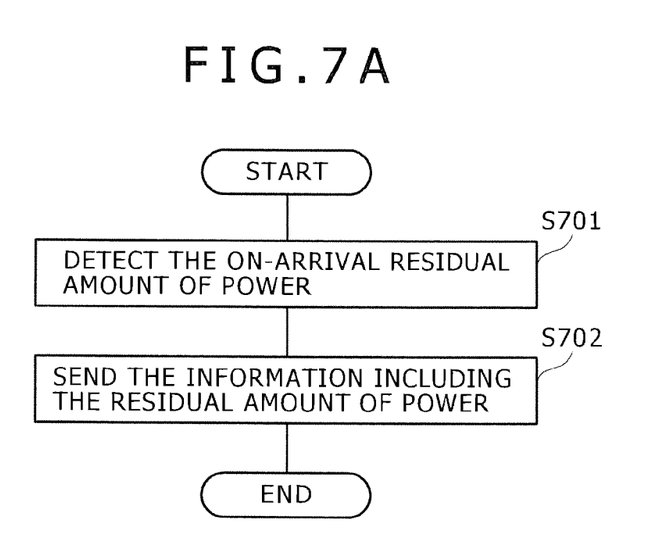
FIGS. 7A and 7B are flowcharts of processes executed when a vehicle arrives at the facility, FIG. 7A being the flowchart showing the process executed by the computer of the vehicle, and FIG. 7B being the flowchart showing the process executed by the computer of the vehicle electric power management apparatus.

FIG. 7A is a flowchart showing a process executed by the computer 30 of one vehicle 3 upon an arrival of the vehicle 3 at one facility 2. After the vehicle 3 has arrived at the facility 2, either a transmission instruction of the user or connection of the vehicle 3 to the battery charger 26 at the facility 2 makes the computer 30 of the vehicle 3 execute the process shown in the flowchart of FIG. 7A.

In step S701, the control unit 31 detects the residual-power information relating to the battery 36. In step S702, the detected residual-power information is transmitted with the user ID of the user who has used the vehicle, the name of the vehicle 3, and the name of the facility 2 where the vehicle 3 is parked, to the vehicle electric power management apparatus 1 via the communications I/F 25. The user ID and vehicle name transmitted at this time are those which have already been entered into the computer 30 of the vehicle 3 and stored into the storage unit 34 before the transmission. Similarly, the name of the facility 2 where the vehicle is parked is that which has already been entered from the input unit 33 before the transmission. The name of the facility 2 where the vehicle is parked may be acquired automatically when the vehicle 3 becomes connected to the battery charger 26 of the facility 2.

Figure 7B:
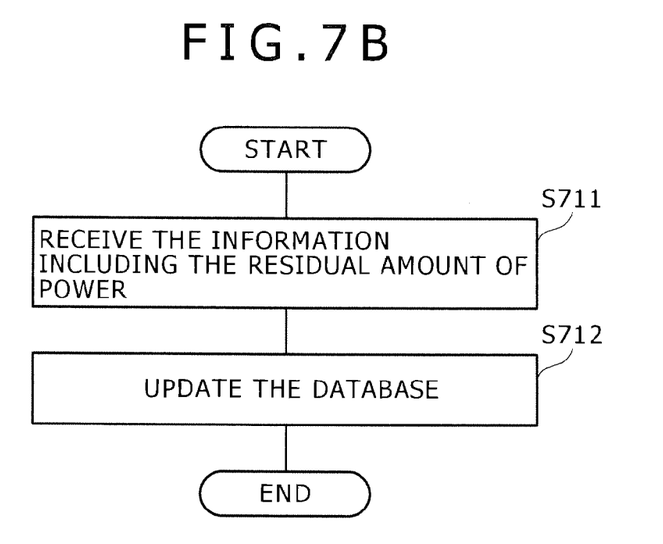

FIG. 7B is a flowchart showing a process executed by the computer 10 of the vehicle electric power management apparatus 1 in response to the transmission from the computer 30 of the vehicle 3 in step S702. In step S711, the computer 10 receives the user ID, the residual-power information, the vehicle name, and the facility name. In step S712, the computer 10 uses the received information to update the database 13 with the user ID as a key. For example, as shown in FIG. 5A, if a record using the user ID as its key already exists, two items of this record, namely the residual power 137 and the arrival vehicle name/arrival facility name combination 138, are replaced by the received residual-power information, vehicle name, and facility name. If a record using the user ID does not exist, a record consisting of the received residual-power information, vehicle name, and facility name is created as the record using the user ID as its key, and the database 13 is updated as such. The total point count 139 in the record is not updated at this point in time, and if the total point count is already stored, that value is saved.

Figure 8A:
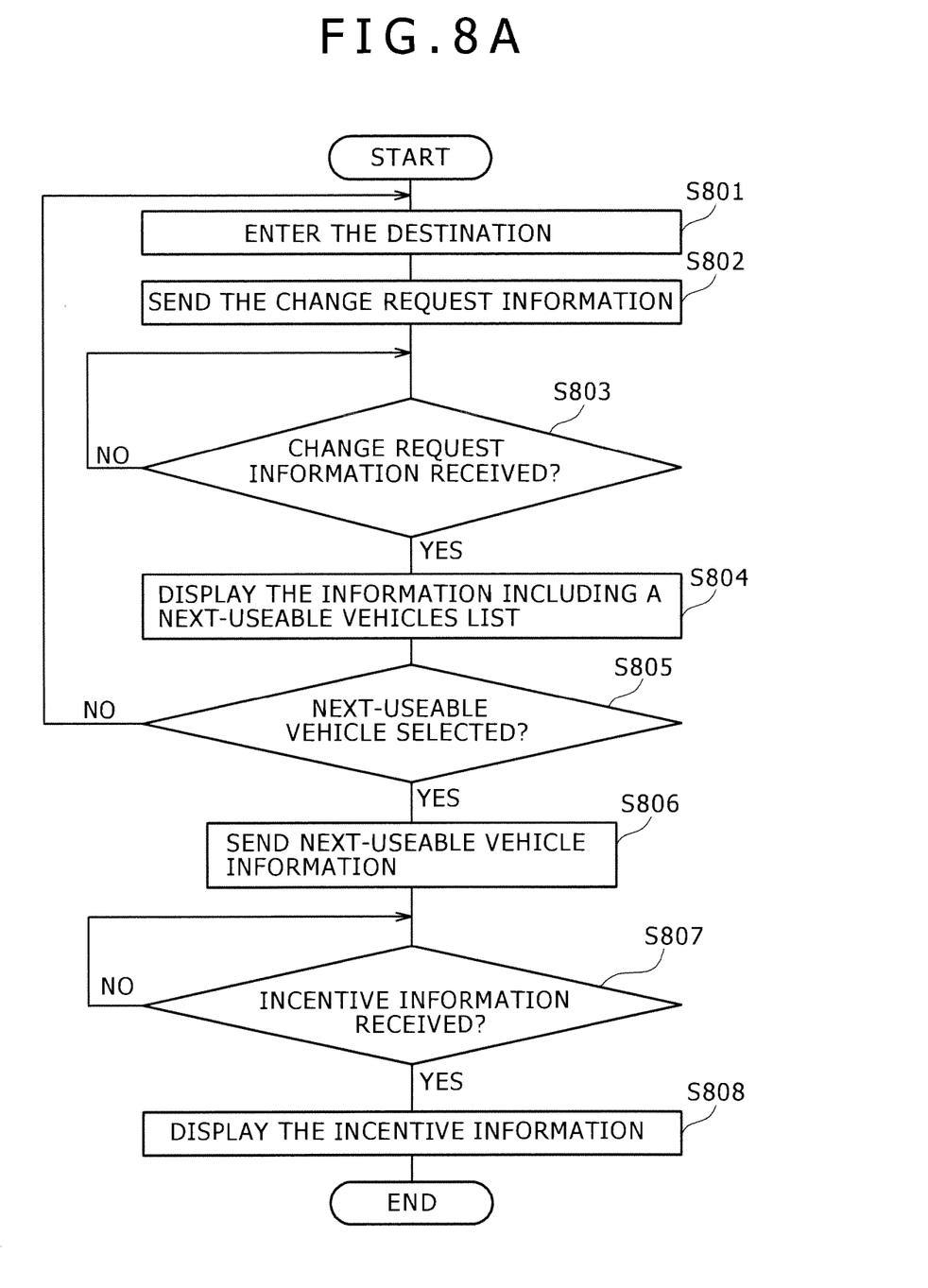
FIGS. 8A and 8B are flowcharts of processes executed when vehicles are changed, FIG. 8A being the flowchart showing the process executed by the computer of the facility, and FIG. 8B being the flowchart showing the process executed by the computer of the vehicle electric power management apparatus.
Figure 8B:
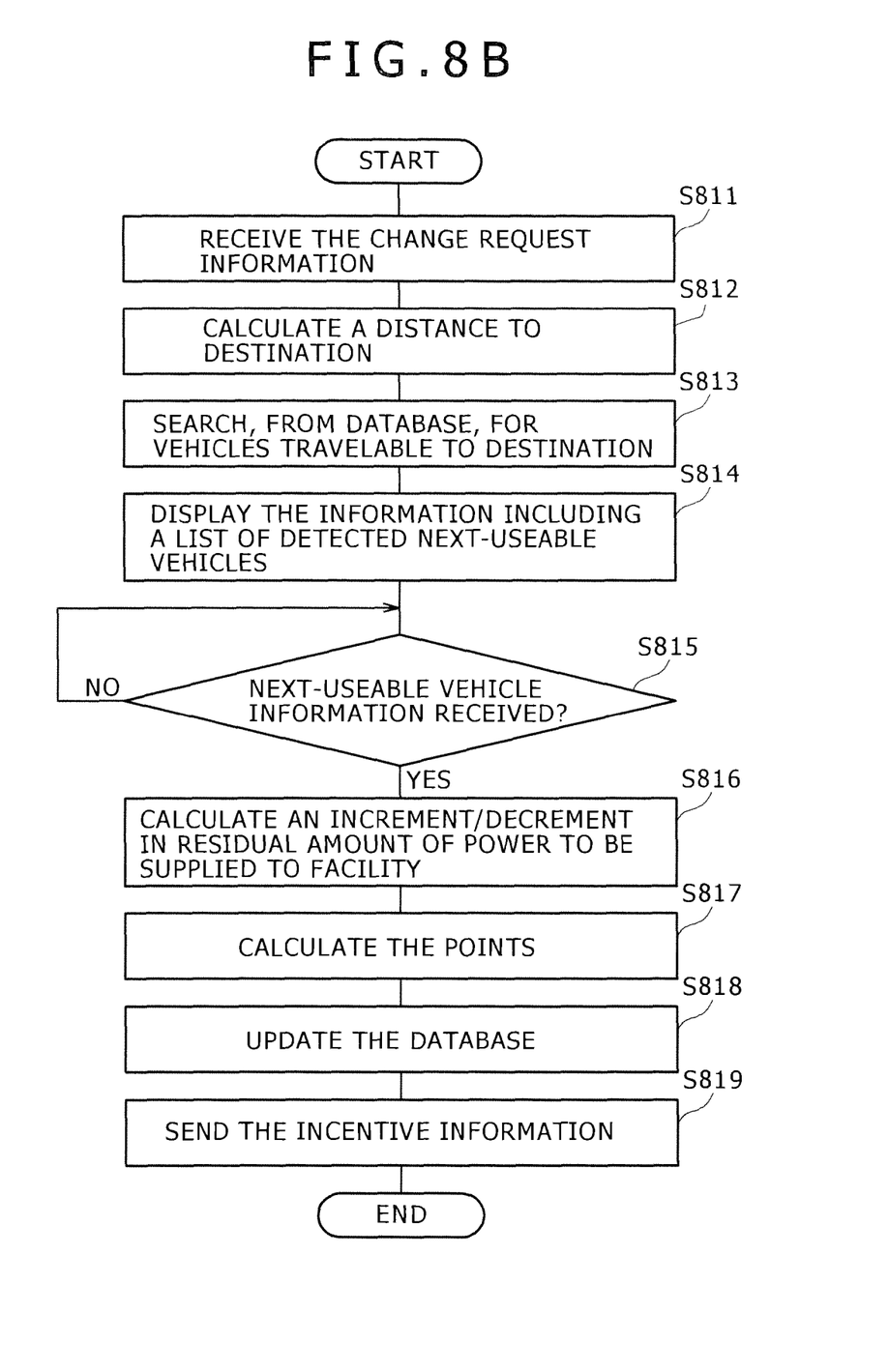

FIG. 8A is a flowchart showing a process executed by the computer 20 of the facility 2 when vehicles 3 are changed at that facility 2, and FIG. 8B is a flowchart showing a process executed by the computer 10 of the vehicle electric power management apparatus 1 during the vehicle change. The user, after arriving at the facility 2, can immediately get into the vehicle to be next used, and start for a destination, or after arriving at the facility 2, can spend a predetermined time at or around the facility 2 for and then get into the new vehicle. When the user performs the vehicle 3 change, he or she uses the input unit 23 of the computer 20 of the facility 2 to enter the user ID and specify the change. The process shown in the flowchart of FIG. 8A will then be executed.

In step S801, the user enters from the input unit 23 the destination to which he or she wishes to go from the facility 2. In step S802, the change request information including the entered destination is transmitted to the vehicle electric power management apparatus 1. This change request information includes the entered user ID and destination, the facility name of the corresponding facility that is stored within the storage unit 24, a search command for the destination, a search command for the next-useable vehicles, and the like. The next-useable vehicle search command will be described later herein.

In step S803, the computer 20 waits for a result of the next-useable vehicle search to be transmitted from the vehicle electric power management apparatus 1 as a response to the change request information. After receiving the search result, the computer 20 displays the received next-useable vehicle information in the display area 221 of the display unit 22 in step S804. As shown in FIG. 6, information on the entered destination is displayed in the display area 221 of the display unit 22 and the distance to the destination is displayed in terms of "rkm" as a search result of the vehicle electric power management apparatus 1. The residual battery power "akwh" of the vehicle which the user has used to arrive at the facility 2 is also displayed along with the vehicle name A of this vehicle. Additionally, up to three vehicles of all those which are next useable are listed in descending order of the residual amount of available battery power, with the smallest value first. The next-useable vehicles are those which the vehicle electric power management apparatus 1 searched for from the database 13 in descending order of the residual amount of battery power, subject to the vehicle being parked at the facility 2 and being able to travel through a distance of at least "rkm" to the destination.

For example, the vehicle B as the vehicle name, the residual battery power "bkwh" of the vehicle B, "lkm" as the distance through which the vehicle B can travel, and a surplus travel distance of "slkm" indicating how far in kilometers the vehicle can further travel on beyond the destination "rkm" away from the facility are displayed on a first row of the next-useable vehicle list. In this list, s1=l−r, s1>0. If the user selects, as the vehicle to be next used, the vehicle 3 whose residual available battery power level is lower than that of the current vehicle and yet this residual available battery power level is a minimum amount of power required for traveling to the destination, then the amount of power equivalent to a difference between the residual available battery power level of the current vehicle and that of the selected vehicle can be supplied to the facility 2. However, since the surplus travel distance is displayed, the user can select another vehicle as the next-useable vehicle, this selection being able to be made based on the surplus travel distance and on the travel to the destination.

The selection of any one of the next-useable vehicles listed in the display area 222 is made by touching the display position corresponding to either the vehicle B, C, or D displayed as the vehicle name. The user is to touch the search button 224 to search for a next-useable vehicle having a surplus travel distance longer than that of any of the next-useable vehicles listed in the display area 222.

Whether the display position of a next-useable vehicle has been selected by touching the particular display position or the search button 224 has been touched is determined in step S805 of FIG. 8A. If the search button 224 is touched, the process returns to step S801, for retrial. To change the destination, the user needs to enter a new destination in step S801 and then in step S802, transmit the change request information including the user ID, the new destination, the facility name, and the search command for the destination, to the vehicle electric power management apparatus 1. The vehicle electric power management apparatus 1 then re-searches for appropriate next-useable vehicles according to the entered new destination.

Conversely if no destination change is conducted, the change request information including the user ID, the destination, the facility name, and the search command for the destination, is transmitted to the vehicle electric power management apparatus 1 in step S802. In this case, the vehicle electric power management apparatus 1 re-searches for the next-useable vehicles having up to fourth to sixth smaller residual amounts of available battery power, than the current vehicle's. If the search button 224 is touched for all displayed vehicle information, without a destination change, the vehicle electric power management apparatus 1 searches for up to three next-useable vehicles having even smaller residual amounts of available battery power. To return to the display of the immediately preceding next-useable vehicle list, the user is to touch a Return button not shown.

The process from steps S801 to S805 is repeated until the user has selected the desired vehicle. Upon the display position of the desired next-useable vehicle being selected by touching, the selected next-useable vehicle information is transmitted to the vehicle electric power management apparatus 1 in step S806.

In step S807, the computer 20 waits for a result of the next-useable vehicle search to be transmitted as incentive information from the vehicle electric power management apparatus 1 as a response to the transmission of the next-useable vehicle information. After receiving the incentive information as the search result, the computer 20 displays the received incentive information in the display area 223 of the display unit 22 in step S808. The example shown in FIG. 6 indicates that the next vehicle that the user is going to use is the vehicle B, that the electric power that has been supplied to the facility P is "a−b" kwh, and that the user has obtained "" points by the selection of the next vehicle to add up to "" points as the total point count at present. Calculation of points will be described later herein. The appropriate number of points is assigned to the user according to the amount of power supplied to the facility 2. The user benefits in that he or she can use the accumulated points to pay for the electric power that he or she has used, for purchases, and for others.

FIG. 8B is a flowchart showing a process executed by the computer 10 of the vehicle electric power management apparatus 1 in response to the transmission of the change request information from the computer 20 of the facility 2. In step S811, the computer 10 receives the change request information and stores the information into the storage unit 15. In step S812, the computer 10 of the vehicle electric power management apparatus 1 refers to the map information of the database 13, based on the facility name and destination included in the stored change request information, searches for a route from the facility to the destination, and calculates a distance to the destination on the detected route. The distance to the destination is calculated, subject to the fact that the destination is that which the user identified by the user ID newly entered or that the destination is that which the user entered.

In step S813, the computer 10 searches for vehicles capable of traveling to the destination, from the database 13. More specifically, the computer 10 sequentially reads out from the database 13 the vehicle information list shown in FIG. 5B, and calculates the distances through which each of the vehicles included in the change request information and parked at the facilities can travel under the conditions of the residual power 132 and the travel distance per unit power 134. After the calculation, the computer 10 stores the vehicle information relating to vehicles whose calculated distances travelable are longer than the distance to the destination, into the storage unit 15. Additionally, the computer 10 rearranges the vehicle information in descending order of the residual available battery power level with the lowest one first, and after selecting up to three next-useable vehicles smaller in the residual amount of available battery power, calculates the surplus travel distance "slkm" indicating how far in kilometers the vehicle can further travel on beyond the destination "rkm" away from the facility. After that, the computer 10 retrieves the user information of the database 13 from the user ID and reads out the residual battery power "akwh" of the vehicle which the user has used to arrive at the facility 2, and the vehicle A of the vehicle which the user is going to next use.

Next, in order to make the display unit 22 of the computer 20 of the facility 2 to display as shown in FIG. 6, the computer 10 transmits in step S814 the distance "rkm" to the destination, the residual battery power "akwh" of the vehicle which the user has used to arrive at the facility 2, and the vehicle A of the vehicle which the user is going to next use. The computer 10 further transmits the vehicle names, residual battery power levels, distances travelable, and surplus travel distances of up to the three next-useable vehicles. If the change request information received from the computer 20 of the facility 2 includes the command for searching for up to the three next-useable vehicles, the computer 10 transmits the vehicle information relating to up to fourth to sixth next-useable vehicles having smaller residual amounts of available battery power. For the next-useable vehicle information currently being displayed in addition to being transmitted to the computer 20 of the facility 2, a flag indicating that the next-useable vehicle information is currently being displayed is stored into the vehicle information of the database 13. This flag, although not shown, is stored to prevent the same next-useable vehicle information from being displayed to other users, even if searched for at the same time.

In step S815, the computer 10 waits for transmission, from the computer 20 of the facility 2, of the next-useable vehicle information as a result of the user's selecting the display position of any one of the next-useable vehicles. After receiving the selected next-useable vehicle information, the computer 10 proceeds to step S816, in which step, the computer 10 then calculates an increment/decrement in the residual amount of available battery power between the selected next-useable vehicle and the vehicle which the user used to arrive at the facility 2.

For example, if the selected next-useable vehicle is the vehicle B having a residual amount of available battery power of "bkwh" and the arrival vehicle has a residual amount of available battery power of "akwh", the computer 10 obtains a calculation result of "a−bkwh" as the increment/decrement between both. After this, based on the increment/decrement in the residual amount of available battery power, point count "e1" is calculated as incentive information in step S817 using Equation 1.

$$e1 = (a-b) \times \alpha/\beta \quad \text{(Equation 1)}$$

where $\alpha$ is a residual power ratio % of the arrival vehicle and $\beta$ is a residual power ratio % of the selected next-useable vehicle. These residual power ratios % are calculated using the value of the full-charge power 135 of the vehicle, stored within the vehicle information of the database 13.

The calculation of the point count "e1" in expression 1 is based on weighting that assigns a higher point count with increasing residual power of the arrival vehicle or decreasing residual power of the selected next-useable vehicle. The weighting is intended to motivate the user to drive a vehicle of a higher residual battery power level to the facility 2 and select a next-useable vehicle of a lower residual battery power level for supplying a larger amount of power to the facility.

The calculation of the point count may instead use Equation 2 or 3.

$$e2 = (a-b) \times \alpha \quad \text{(Equation 2)}$$

$$e3 = (a-b)/\beta \quad \text{(Equation 3)}$$

where, as with those of expression 1, α is a residual power ratio % of the arrival vehicle and β is a residual power ratio % of the selected next-useable vehicle.

In step S818, the computer 10 reads out the total point count by searching for the user information of the database 13 with the user ID as the key, and then updates the database 13 by adding the above-calculated point count to the total point count which has been read out. In step S819, the computer 10 transmits the incentive information relating to the user, such as the point count.

For example, in order to make the display unit 22 of the computer 20 of the facility 2 to display as shown in FIG. 6, the computer 10 transmits information on the "vehicle B" indicating next-useable vehicle, "a–b kwh" indicating the power supplied to the facility P, the currently added point count of the user, and the total point count. If the "Residual battery power level of the arrival vehicle–Residual battery power level of the selected next-useable vehicle" is 0 or less, the point count added will be 0 and the total point count will not be added.

The total point count stored within the database 13 is read out with the user ID as the key when the user uses the total point count to pay for the consumed battery power, purchases, and others. The user is assigned the appropriate number of points not exceeding the stored total point count, and when part of these points is used, the total point count will be corresponding subtracted and the database 13 updated as such. The total point count will be erased when its valid term expires.

Battery charging of the particular vehicle 3 may be started immediately after the arrival of the vehicle at the facility 2. Instead, however, depending on a battery charge status of each vehicle 3 parked at the facility 2, the charging of the batteries 36 mounted on each vehicle 3 may be started or stopped so that an average residual amount of available battery power of the vehicles 3 distributed at the facility 2 will range between 100% and 30%. This will prevent excessive charging from taking place at the facility 2, while at the same time, offering a wider range of next-useable vehicle selection associated with a vehicle change, and suppressing the consumption of electric power.

If the vehicle 3 that has arrived has a large residual amount of battery power, this power may be supplied to the facility 2 according to the battery charge status of each vehicle 3 parked at the facility 2. Surplus battery power can be effectively utilized by, for example, charging other necessary vehicles 3 within the facility 2 with the supplied power or supplying the surplus power to electrical equipment present in the facility 2.

While the above embodiment has been described using the residual battery power "kwh" of the vehicle 3, this information can instead be any other information having a correlation with respect to the residual battery power, such as the residual battery power ratio "%", the residual distance travelable, "km", or consumed battery power "kwh"; these factors being hereinafter referred to collectively as residual power information.

—Operational Effects of the Embodiment—

(1) The vehicles having residual power values obtained by adding the amount of power that enables traveling through a predetermined surplus travel distance, to the residual amount of power with which the vehicle can travel through the distance to the destination, have been searched for as the next-useable vehicles in the above embodiment. Selecting any one of the detected next-useable vehicles, therefore, enables the user to avoid consuming the residual battery power of the vehicle before reaching the destination.

(2) In the above embodiment, the plurality of next-useable vehicles having the residual battery power that enables traveling have been listed in descending order of the residual amount of battery power. The user can therefore select a desired next-useable vehicle accurately from all those listed in descending order of the residual amount of battery power.

(3) In the above embodiment, an increment/decrement in the residual amount of available battery power has been used as the basis for calculating the point count as incentive information and assigning the calculated number of points to the user. This benefits the user in that he or she can use accumulated points to pay for the consumed electric power, purchases, and others. The above also enhances the motivation for supplying more electric power to the facility.

(4) In the above embodiment, weighting that assigns a higher point count with increasing residual power of the arrival vehicle or with decreasing residual power of the selected next-useable vehicle has been used for the calculation of the point count as incentive information, based on the increment/decrement in the residual amount of available battery power. This further motivates the user to drive a vehicle of a higher residual battery power level to the facility and select a next-useable vehicle of a lower residual battery power level for supplying a larger amount of power to the facility.

—Modifications—

(1) In the above embodiment, next-useable vehicles have been searched by searching from the database 13 for the vehicle information relating to vehicles capable of traveling through a longer distance than the distance to the destination, and the searched next-useable vehicles have been displayed on the display unit 22 in descending order of the residual available battery power. However, there may be a case in which the surplus travel distance to the destination is very short. During the database search for the next-useable vehicles, therefore, the vehicles having the residual power values obtained by adding the amount of power that enables traveling through the predetermined surplus travel distance, to the residual amount of power with which the vehicle can travel through the distance to the destination, may be searched for using the residual-power information stored within the database 13. And these vehicles may be displayed on the display unit 22 in descending order of the residual amount of battery power. The predetermined surplus travel distance in such a case can be either a value predefined by the vehicle electric power management apparatus 1, or the user-specified, predetermined surplus travel distance value stored under the user information of the database 13. Further alternatively, prior to the search for and output of next-useable vehicles, information on traffic congestion on the route to the destination, arrival time information, and the like may also be considered and the surplus travel distance value increased according to a particular level of the congestion. If the predetermined surplus travel distance is thus incorporated as an additional consideration prior to the search for the next-useable vehicles, this enables the user to avoid selecting a next-useable vehicle 3 likely to run out of its residual battery power before the vehicle 3 reaches the destination.

(2) In the above embodiment, point calculations have been conducted after the selection of one next-useable vehicle by the user. Instead, when search results on the next-useable vehicles are output, point calculations may occur for each next-useable vehicle and the current point count may be displayed with each next-useable vehicle. This enables the user, before selecting one of the next-useable vehicles, to know a point count planned to be assigned, and thus to also consider the point count before conducting the selection.

(3) An example of using the computer 20 of one facility 2 as a terminal unit to enter a destination and other information and select one next-useable vehicle has been described in the above embodiment, but other terminal units may be used. For example, the user can use a user terminal unit of his or her own to enter predetermined login information and the user ID, thereby connecting the user terminal unit to the vehicle electric power management apparatus 1 and then make the proper computer execute substantially the same process as that shown in the flowchart of FIG. 8A.

(4) Although an example of using the computer 20 as a terminal unit has been described in the above embodiment, this terminal unit can instead be a thin client terminal unit. The thin client terminal unit has input/output and send/receive functions, and the computer of the vehicle electric power management apparatus 1 executes the process shown in the flowchart of FIG. 8A. More specifically, the entry of a destination in step S801, the selection of one next-useable vehicle in step S805, and other operations are performed using an input unit of the thin client terminal unit, and these operational signals are transmitted to the computer 10 of the vehicle electric power management apparatus 1. Upon receiving the operational signals, the computer 10 of the vehicle electric power management apparatus 1 executes substantially the same process as that shown in the flowchart of FIG. 8B. More specifically, in step S815, the computer 10 creates the display data that includes information such as next-useable vehicle information, and then transmits the created display data to the thin client terminal unit, and in step S819, creates the display data relating to incentive information and transmits this created display data to the thin client terminal unit. The thin client terminal unit upon receiving the two sets of display data displays the information including the next-useable vehicle information, and the incentive information, on the display unit.

While the above embodiment has been described taking as an example the electric automobile that travels on the power supplied from the battery of the vehicle, the present invention can also be applied to a combination of electric automobiles and so-called plug-in hybrid automobiles. Plug-in hybrid automobiles are hybrid automobiles each equipped with batteries of a capacity smaller than that of an electric automobile's battery. Each plug-in hybrid automobile includes an engine, a power generator driven by the engine to generate electricity, vehicle-mounted batteries as a traveling-motor power supply, and a traveling motor that makes the vehicle travel on the power supplied from the vehicle-mounted batteries as well as on the power generated by and supplied from the generator. The apparatus and system of the present invention can also be used in applications that involve combining such plug-in hybrid automobiles and electric automobiles.

In this case, it will suffice just to add a residual amount of available engine-driving fuel, engine fuel economy, and other such information, as considerations in power management. However, as in electric automobiles, a distance through which the vehicle can travel on the residual battery power may only need to be used as a basis for power management, without considering the distance travelable in engine-only mode.

Unless the characteristic functions of the present invention are degraded, the invention is not limited to the configuration in the above embodiment.

What is claimed is:

1. A vehicle electric power management apparatus for a vehicle electric power supply system, the vehicle electric power supply system including vehicles each equipped with a battery, facilities each configured to supply battery electric power to each of the vehicles, the vehicle electric power management apparatus configured to collect information on a residual amount of useable vehicle-mounted battery electric power, and a terminal unit configured to receive the residual-power information from the vehicle electric power management apparatus, the vehicle electric power management apparatus comprising:

vehicle information storing unit configured to hold internally the information relating to the residual available electric power of each vehicle;

search unit for a user, before changing vehicles at one of the facilities to travel therefrom to a destination, configured to retrieve the residual-power information from the vehicle information storing unit and to search for a vehicle having a residual amount of available electric power sufficient for traveling through a distance to the destination;

processing unit configured to calculate a relative increment/decrement in the residual amount of available electric power between the vehicle that the user has traveled to the facility, and the vehicle searched for as a vehicle to be next used; and output unit configured to deliver, as a notification to the user, information on the calculated increment/decrement in the residual amount of available electric power due to the vehicle change, and information on the vehicle to be next used, to the terminal unit.

2. The vehicle electric power management apparatus according to claim 1, wherein:

when the user changes vehicles at one of the facilities to travel from the facility to the destination, the search unit is configured to use the stored residual-power information within the vehicle information storing unit to search for a vehicle having a residual amount of available battery power obtained by adding electric power sufficient for the vehicle to travel through a predetermined surplus travel distance, to a residual amount of available battery power sufficient for the vehicle to travel through the distance to the destination.

3. The vehicle electric power management apparatus according to claim 1, wherein:

the search unit is configured to use the stored residual-power information within the vehicle information storing unit to search for a vehicle having the residual amount of available battery power sufficient for traveling; and the output unit is configured to output information on vehicles useable to the user after the vehicle change, the vehicles being output in descending order of a residual amount of available battery power, with the vehicle of the smallest residual amount of available battery power first.

4. The vehicle electric power management apparatus according to claim 1, further comprising:

user information storing unit;

wherein, the processing unit is configured to calculate incentive information based on a difference between the residual amount of available battery power of the vehicle which the user has traveled to the facility, and a residual amount of available battery power of the vehicle to he next used, and to store the incentive information into a location for the particular user, of the user information storing unit, and the output unit is configured to deliver the calculated incentive information to the terminal unit.

5. The vehicle electric power management apparatus according to claim 4, wherein:

in the calculation of the incentive information, the processing unit is configured to weigh the incentive information more heavily either with increasing residual battery power of the vehicle which the user has traveled to the facility, or with decreasing residual battery power of the next-useable vehicle selected by the user.

6. A vehicle electric power management system for a vehicle electric power supply system, the vehicle electric power supply system including vehicles each equipped with a battery, facilities each configured to supply battery electric power to each of the vehicles, the vehicle electric power management apparatus configured to collect information on a residual amount of useable vehicle-mounted battery electric power, and a terminal unit configured to receive the residual-power information from the vehicle electric power management apparatus;

wherein:

the vehicle electric power management apparatus includes vehicle information storing unit configured to hold internally the information relating to the residual available electric power of the vehicle, search unit for a user, before changing vehicles at one of the facilities to travel therefrom to a destination, configured to retrieve the residual-power information from the vehicle information storing unit and to search for a vehicle having a residual amount of available electric power sufficient for traveling through a distance to the destination, processing unit configured to calculate a relative increment/decrement in the residual amount of available electric power between the vehicle that the user has traveled to the facility, and the vehicle searched for as a vehicle to be next used, and output unit configured to deliver, to the terminal unit, information on the calculated increment/decrement in the residual amount of available electric power due to the vehicle change, and information on the vehicle to be next used;

the terminal unit includes receiving unit configured to receive the residual-power increment/decrement information delivered from the vehicle electric power management apparatus, and the information relating to the vehicle to be next used, display unit configured to display the received residual-power increment/decrement information and the information relating to the vehicle to be next used, input unit configured to select, in response to specification by the user, the displayed information relating to the vehicle to be next used, and transmission unit configured to transmit the selected vehicle information to the vehicle electric power management apparatus; and the vehicle electric power management apparatus is configured to store and manage increments/decrements in residual amounts of available electric power, on a user-by-user basis, in accordance with the vehicle information selected by users using the terminal unit.

7. A method of managing a vehicle electric power management apparatus for a vehicle electric power supply system, the vehicle electric power supply system including vehicles each equipped with a battery, facilities each configured to supply battery electric power to each of the vehicles, the vehicle electric power management apparatus configured to collect information on a residual amount of useable vehicle-mounted battery electric power, and a terminal unit configured to receive the residual-power information from the vehicle electric power management apparatus, the method comprising:

storing, using a computer, the residual-power information;

searching, using the computer, for a user, before changing vehicles at one of the facilities to travel therefrom to a destination, to retrieve the stored residual-power information and searching, using the computer, for a vehicle having a residual amount of available electric power sufficient for traveling through a distance to the destination;

calculating, using the computer, a relative increment/decrement in the residual amount of available electric power between the vehicle that the user has traveled to the facility, and the vehicle searched for as a vehicle to be next used; and delivering, using the computer, as a notification to the user, information on the calculated increment/decrement in the residual amount of available electric power due to the vehicle change, and information on the vehicle to be next used, to the terminal unit.

* * * * *